United States Patent [19]

Schülke et al.

[11] Patent Number: 4,775,317
[45] Date of Patent: Oct. 4, 1988

[54] OVEN FOR THE HEAT TREATMENT OF SEMICONDUCTOR SUBSTRATES

[75] Inventors: Karl A. Schülke, Neuberg, Fed. Rep. of Germany; Christopher J. Bayne, Lightwater; Geoffrey Hayward, North Camberley, both of England

[73] Assignee: Heraeus Quarzschmelze GmbH, Hanau, Fed. Rep. of Germany

[21] Appl. No.: 59,820

[22] Filed: Jun. 9, 1987

[30] Foreign Application Priority Data

Nov. 16, 1984 [DE] Fed. Rep. of Germany ....... 3441887

[51] Int. Cl.$^4$ .............................................. F27B 9/26
[52] U.S. Cl. ................................. 432/241; 432/254.2; 432/258
[58] Field of Search ............... 432/240, 241, 245, 249, 432/253, 254.1, 254.2, 258.11, 261

[56] References Cited

U.S. PATENT DOCUMENTS

| 614,768 | 11/1898 | Schwedtmann | 432/241 |
|---|---|---|---|
| 1,895,408 | 1/1933 | Davis | 432/258 |
| 2,558,088 | 6/1951 | Hoop | 432/254.2 |
| 2,629,917 | 3/1953 | Lovatt | 432/253 |
| 2,879,577 | 3/1959 | Milburn | 432/258 |
| 3,997,289 | 12/1976 | Bowers | 432/258 |
| 4,102,637 | 7/1978 | Kreider et al. | 432/253 |
| 4,412,812 | 11/1983 | Sadowski et al. | |
| 4,487,579 | 12/1984 | Irwin | 432/241 |

FOREIGN PATENT DOCUMENTS

| 528651 | 5/1954 | Belgium | 432/258 |
|---|---|---|---|
| 8021868 | 1/1981 | Fed. Rep. of Germany | |
| 1076726 | 2/1984 | U.S.S.R. | 432/258 |
| 534546 | 3/1941 | United Kingdom | 432/258 |
| 538137 | 7/1941 | United Kingdom | 432/258 |
| 781523 | 8/1957 | United Kingdom | 432/258 |
| 2082388 | 5/1984 | United Kingdom | |

Primary Examiner—Henry C. Yuen
Attorney, Agent, or Firm—Felfe & Lynch

[57] ABSTRACT

An oven for the heat treatment of semiconductor substrates, especially a diffusion oven, having an upright, heatable quartz tube and a support system made of up rods or tubes into which one or more diffusion racks can be inserted which accommodate the wafer-like substrates separated from one another and substantially parallel to one another. To create a vertically operated oven having a rheologically efficient construction in which the support system for holding the diffusion racks will be highly variable, the support system has at least two vertical supports arranged parallel to one another, on which at least one rack rest 9 is disposed, on which rack rest the diffusion rack is placed such that the substrate wafers 8 stand substantially on edge during the treatment.

1 Claim, 3 Drawing Sheets

OVEN FOR THE HEAT TREATMENT OF SEMICONDUCTOR SUBSTRATES

BACKGROUND OF THE INVENTION

The present invention relates to an oven for the heat treatment of semiconductor substrates.

Such a vertically operated oven system for the heat treatment of semiconductor substrates is disclosed in U.S. Pat. No. 4,412,812. The support system which can be hung in the oven has a frame into which the individual racks are placed in the horizontal arrangement. In the vertical arrangement of the carrying system suspended in the oven, the racks bearing the substrate wafers are secured by a rod lying against the wafers, which in turn is held on arms projecting from the support system and extending over the substrate wafers. In this working position the substrate wafers are aligned substantially horizontally, i.e., perpendicular to the oven axis, and in this horizontal alignment they constitute a considerable resistance to flow for process gases passed longitudinally through the oven tube. Furthermore, the support system is virtually unchangeable as regards the different sizes of racks and wafers.

Setting out from this state of the art, the present invention is aimed at the problem of creating a vertically operated oven which will have a rheologically efficient structure, and whose support system will be easily changeable for the accommodation of the racks.

SUMMARY OF THE INVENTION

This problem is solved according to the invention. Into our support system, appropriately dimensioned racks for holding semiconductor substrates can be inserted, such as those, for example, which are disclosed in German Gebrauchsmuster No. 80 21 868. Inasmuch as the substrate wafers stand on edge in the racks, i.e., they are aligned parallel with the axis of the tubular oven used in the process, the path of flow in the vertical direction in the oven is largely unobstructed. A process gas, for example, can flow uniformly and virtually without hindrance around each wafer. Furthermore, precisely on account of the vertical arrangement of the wafers in the oven, any sagging of the wafers of their own weight when they are heated is prevented. By the stacked arrangement of the supports with their wafers upright in them, it is furthermore brought about that the oven capacity is advantageously utilized no matter what the diameter of the wafer is. The rack rests are in such a case disposed on vertical supports such that the racks and the semiconductor wafers of the next rack below are directly adjacent to the rack above without waste of space.

Preferably the support system of the oven has four vertical supports which are arranged to form the corners of a quadrangle or rectangle. With these four vertical supports an extremely stable structure is achieved for the support system. With such a system of four vertical supports it is possible to position the rests supporting the individual racks, in a simple manner such that the east-west and north-south orientation of the wafers will alternate from level to level or rack to rack. In this manner it is especially possible to achieve a uniform gas flow.

Especially advantageous are support components in the form of shoes which have crosspieces fixedly joined to them at right angles to the axis of the shoe, and which are fitted to the vertical supports and can be locked at any desired height on the vertical supports. In this case the shoes can, to special advantage, be in the form of rings which are adapted to the vertical supports such that they can be stacked by slipping them over the free ends of the latter. If the support system, as already mentioned, has four vertical supports, it is possible, by means of two crosspieces on which a rack rests and which are equipped each with two shoes and join two adjacent vertical supports together, to achieve on the one hand a uniform distribution of the weight to the individual vertical supports, and on the other hand to stabilize the support system. If the racks are stacked so as to be alternately in the north-south and east-west orientations, a reinforcement of all four vertical supports is simultaneously achieved without any other constructional measures. If the four vertical supports are arranged to form the corners of a quadrangle, identical rack rests can be used in either orientation. If the orientation of the stacked racks on their rack rests is not alternated, it is desirable to stabilize the vertical supports by means of additional cross braces, one of which is then provided between the pairs of vertical supports that are not joined together by crosspieces. These cross braces, like the rack rests, have two rings joined together by a rod and can be slipped over the vertical supports.

The individual stacked rack rests can be spaced apart from one another by spacer tubes which are placed on the vertical supports between the rings of the rack rests. The length of the spacer tubes can be selected in accordance with the diameter of the substrate wafers and thus with the required clearance between the rack rests. Such spacer tubes can be stocked in a series of standard lengths. The strength of the vertical supports can be improved by making them in the form of tubes into which reinforcing rods of ceramic material such as aluminum oxide or silicon carbide are inserted.

A compact and rheologically efficient oven can be achieved if the vertically disposed, heated processing tube has an approximately rectangular cross section adapted to the outside dimensions of the support system.

In the case of an oven with a stationary processing tube and a support system which can be moved into and out of the tube, a terminal support disk is affixed to the bottom ends of the vertical supports, and projects beyond the outer circumference of the vertical support, and the rings of the rack rests and cross braces, or the spacer tubes, rest thereon.

In accordance with the invention, an oven for the heat treatment of semiconductor substrates, especially a diffusion oven, comprises a heatable, vertically disposed processing tube and a support system including at least two vertical supports onto which one or more diffusion racks containing disk-shaped substrates with spacing and substantially parallel to one another are disposed, the support system including at least one supporting element disposed on each of the at least two vertical supports, and the support system including one or more racks so placed that substrate disks in each of the racks point substantially in the vertical direction during treatment.

Additional details and features of the invention will be found in the following description of an embodiment in conjunction with the drawing.

DESCRIPTION OF PREFERRED EMBODIMENTS

Figure 1:
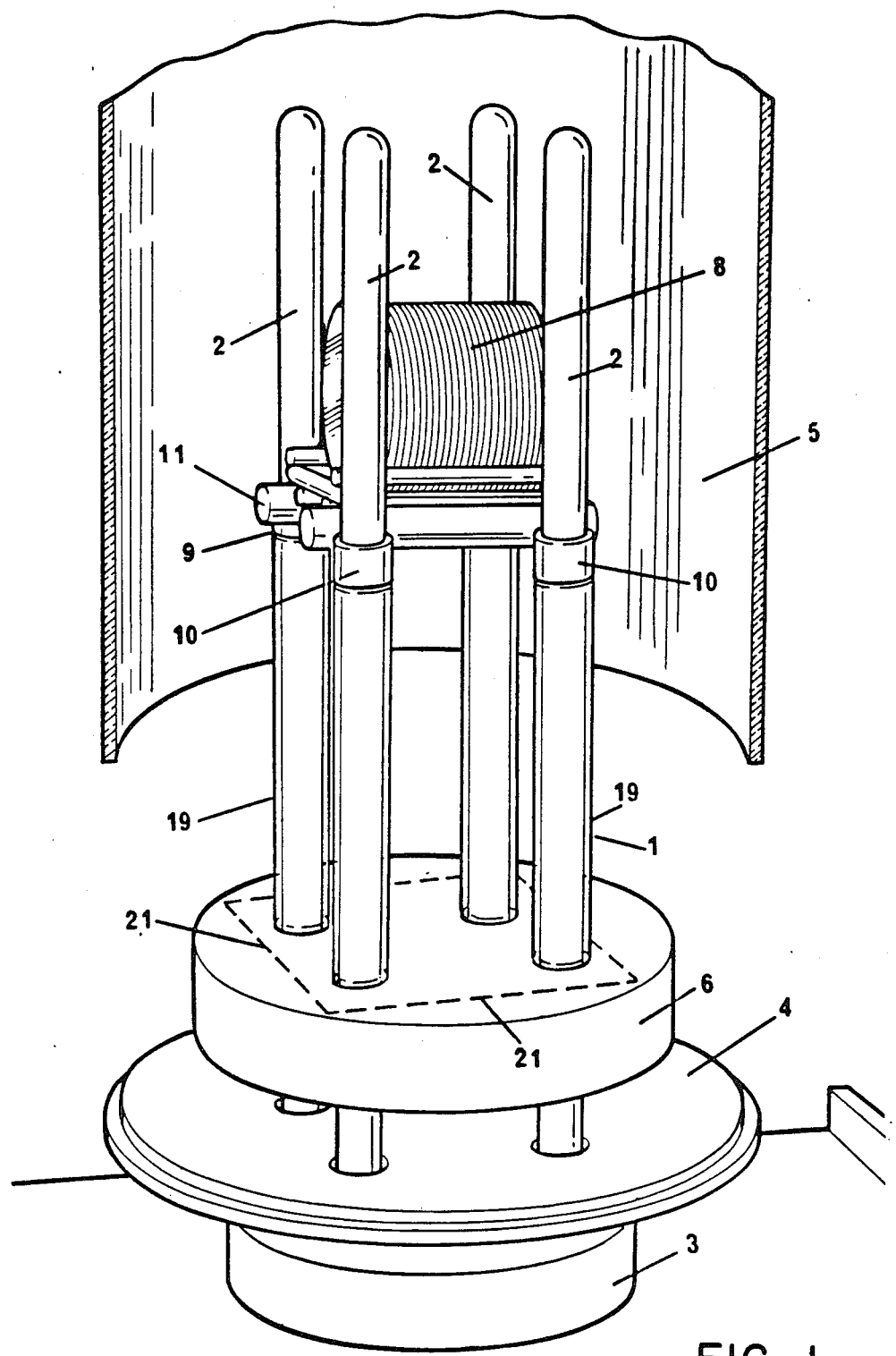
FIG. 1 is a perspective view of a support system having four vertical supports which are held by their bottom ends.
Figure 2:
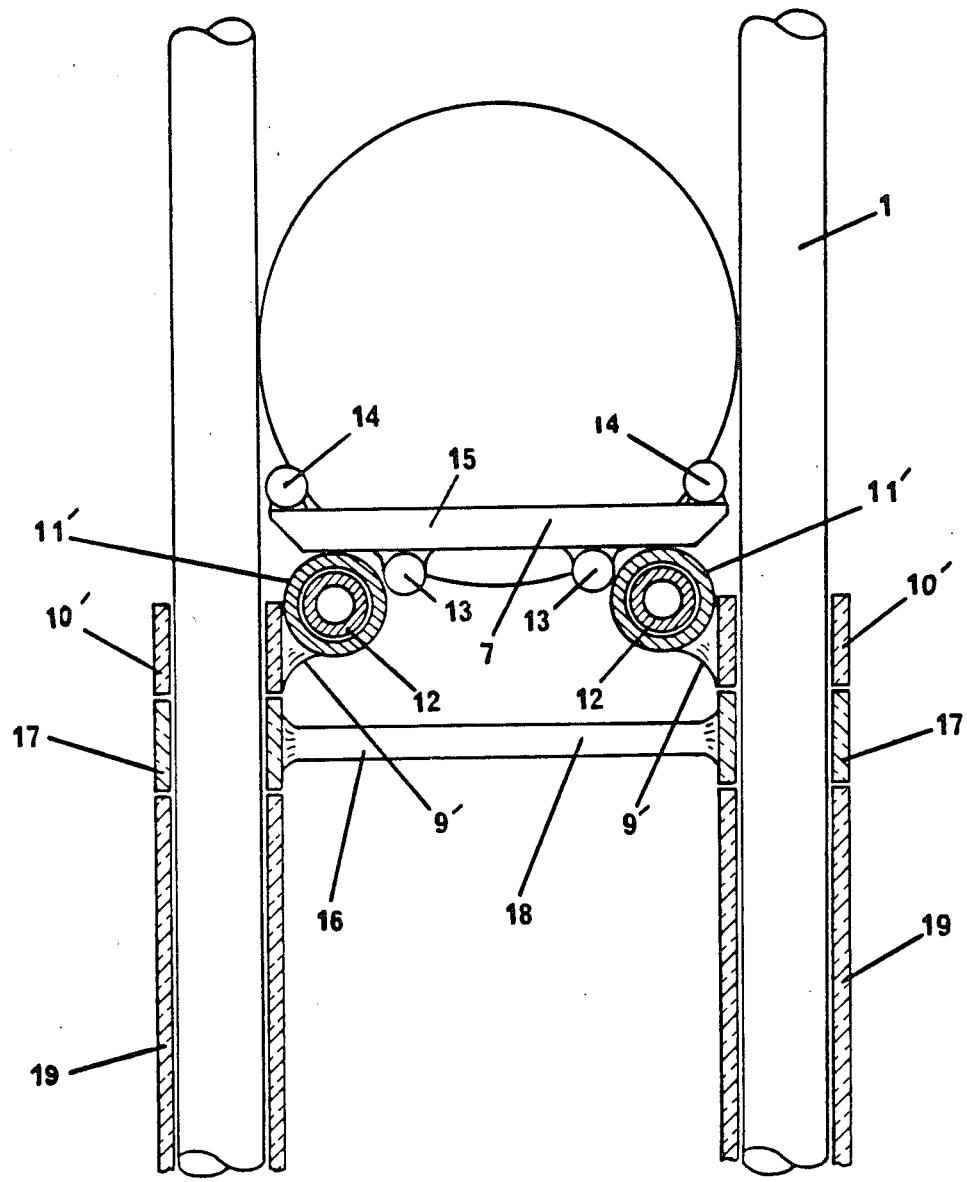
FIG. 2 is a fragmentary, sectional view of two vertical supports with racks disposed thereon.

The support system 1 shown in FIG. 1 preferably has four vertical supports in the form of rod-like or tube-like uprights 2 which are held in a base 3 so as to form the corners of a quadrangle. A closure plate 4, preferably of metal having an overlay of vitreous fused silica, preferably is set down over the uprights 2 and rests upon the base 3, and preferably an oven tube 5 of quartz, which is partially cut away in this drawing, rests on the overlay. On the closure plate 4 rests an insulator 6, which is made, for example, of vitreous fused silica and quartz wool, and whose outside diameter preferably is fitted to the inside diameter of the vitreous fused silica tube 5. Depending on requirements, one (FIG. 1) or more (FIG. 3) racks 7 bearing a plurality of semiconductor substrate wafers 8 can be inserted into the support system 1. As illustrated in FIG. 2, the racks 7 preferably are each supported by two rack rests 9'. Rests 9' appropriate for the support system 1 using four uprights 2 preferably have each two tubular rings 10' which are joined together by a crosspiece 11 at the distance between two uprights 2. The inside diameter of the tubular rings 10' preferably is selected such that the rings 10' can easily be slipped over the free end of the uprights 2. In the embodiment shown in FIG. 2, in which the support system 1 has only two uprights 2, a single ring 10' preferably is fastened approximately centrally on the cross piece 11' supporting the racks 7. The crosspieces 11 and 11' preferably are in this embodiment tubes of circular cross section containing a reinforcing rod 12 of ceramic material such as aluminum oxide or silicon carbide.

So-called rod racks, such as those also shown in this embodiment, are used preferentially. These rod racks, which preferably are composed of two lower longitudinal rods 13 and two upper longitudinal rods 14, joined together at their ends by transverse tubes 15, have the advantage that the lower longitudinal rods 13 can serve simultaneously as feet to rest against the crosspieces 11 and 11' connecting the rests 9 and 9' to effectively prevent any lateral displacement of the racks on the rests.

If required, the support system 1 can be strengthened by providing cross braces 16 between those uprights 2 which are not joined together by a crosspiece 11 between rests 9. Each of these cross braces 16 preferably has two rings 17, which can be slipped over the uprights 2 and are joined together by a rod 18. In the case of a support system 1 having four uprights 2, the uprights 2 are braced in the one direction by the crosspieces 11 and in the other direction by the cross braces 16, while in the case of a support system 1 having two uprights (see FIG. 2) the uprights 2 are reinforced only by the crosspieces 11. Precisely in the case of a support system having four uprights 2, the cross braces 16 can be dispensed with especially when a plurality of racks are disposed alternately in the north-south and east-west directions, so that the uprights 2 are joined with one another alternately in pairs.

Figure 3:
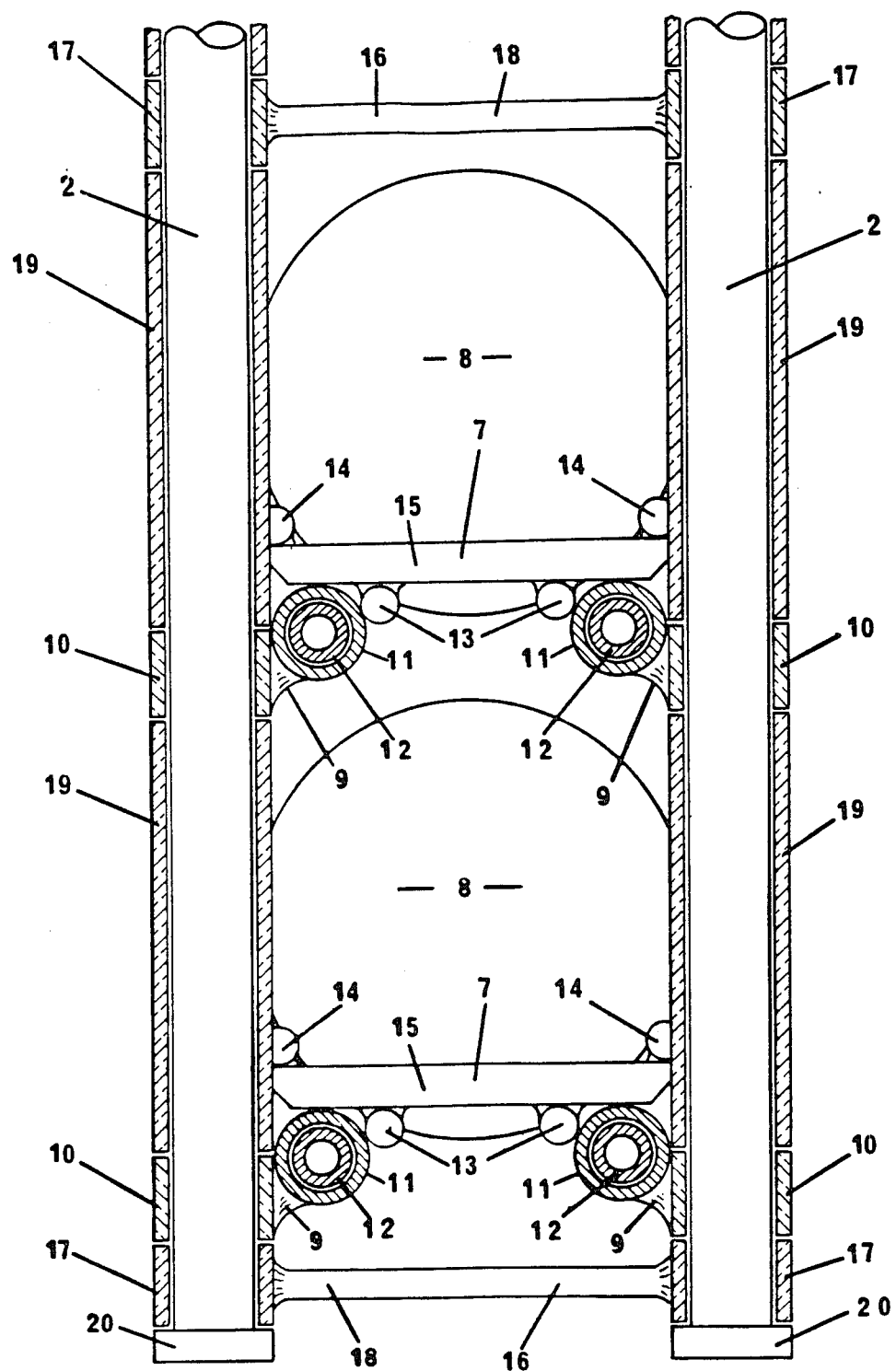
FIG. 3 is a fragmentary, sectional view of a support system in which the vertical supports are held by their upper ends, and two wafer racks are inserted into the system.

As can be seen in FIG. 3, the individual stored racks 7 preferably are spaced apart by means of spacer tubes 19 slipped onto the uprights 2. The length of these spacer tubes preferably is made such that each set of two adjacent rests 9 or their rings 10 are spaced apart from one another such that the racks 7 resting on the crosspieces 11 and the substrate wafers 8 inserted in them adjoin one another without any great interval between them. If required, a succession of a cross brace 16, a rest 9, a spacer tube 19, another rest 9, a spacer tube 19, a cross brace 16, and so on, can be stacked on each individual upright 9. If it is necessary to dispose an additional cross brace 16 between two stacked racks 7, the length of the spacer tubes can be varied accordingly in order to accommodate the racks 7 with the semiconductor substrate wafers 8 in a space-saving manner.

Whereas in the case of the support system in FIG. 1, an upstanding arrangement is involved, i.e., in this case the uprights are held at the bottom with their free ends pointing upward, the support system in FIG. 3 is a depending arrangement, i.e., the vertical supports 2 are suspended by their upper ends, which are not shown. In the latter type of construction each vertical support 2 preferably has at its bottom, free end a bottom supporting disk 20 on which the individual racks with their rests and cross braces are supported. In this case, in order to prevent the vertical supports 2 from spreading apart under the effect of the load they are supporting, a cross brace 16 preferably is provided as the bottommost component lying directly on the bottom supporting disks 20.

The modular construction of the support system, with the individual identical modules in the form of the rests 9 and 9', the cross braces 16 and 16', and the spacer tubes 19, which can be stocked in graded sizes, enables the system to be modified simply, as needed. The possibility also exists of using only one rack approximately in the center of the support system, as shown in FIG. 1, by placing spacer tubes 19 on the closure plate 4 or on the insulator 6 as the lowermost elements.

While the oven tube 5 in FIG. 1 has a round cross section, an advantageous variant is to be seen in a square or rectangular cross section as indicated by the broken lines 21 on the insulator 6. With such a cross section the processing chamber is adapted to the support system, and the open cross-sectional areas through which a process gas might flow ineffectively are not all too great.

In the support system 1, the substrate wafers 8 are arranged on edge and thus gases can flow over them uniformly on both sides. In the case of the racks 7 inserted one above the other in the support system, the flow of gases is still further improved by alternating the orientation of the racks 7. In the illustrated support system, four to five racks can easily be accommodated simultaneously if one assumes that the diameter of such substrate wafers 8 amounts to up to 200 mm.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. An oven for the heat treatment of semiconductor substrates, especially a diffusion oven, comprising:

a heatable, vertically disposed oven processing vitreous silica tube having a vertical longitudinal axis for passing processing gas flow longitudinally through the oven tube in the vertical direction; and a support system including at least two vertical supports comprising vitreous silica onto which one or more diffusion racks containing disk-shaped semiconductor substrates with spacing and substantially parallel to one another are disposed in said oven processing tube, said support system including at least one supporting member comprising vitreous silica disposed on each of said at least two vertical supports, said support system also including one or more spacer sleeves on each of said at least two vertical supports for positioning said supporting member and said at least one supporting member including at least one additional sleeve on each of said at least two vertical supports and including a horizontally disposed crosspiece fixedly joined to said additional sleeves, said support system including said one or more racks so placed that said disk-shaped semiconductor substrates in each of said racks point substantially in the vertical direction during treatment, whereby the path of gas flow in the vertical direction is largely unobstructed, and in which oven said additional sleeves included in said at least one supporting member comprise rings surrounding said supports, and in which oven on each of said supports there is disposed a number of said supporting members corresponding to the number of diffusion racks and which includes a spacer tube for separating supporting members of two stacked racks of one support and which includes between each two supports which are not joined by a common crosspiece a cross brace joining the corresponding two supports and in which said cross brace has two rings which are joined fixedly together by a rod-like body.

* * * * *